(12) United States Patent
Kim et al.

(10) Patent No.: US 8,192,546 B2
(45) Date of Patent: Jun. 5, 2012

(54) DEPOSITION APPARATUS

(75) Inventors: Hun Kim, Suwon-si (KR); Jin-Woo Park, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 1385 days.

(21) Appl. No.: 11/637,375

(22) Filed: Dec. 11, 2006

(65) Prior Publication Data
US 2007/0137571 A1    Jun. 21, 2007

(30) Foreign Application Priority Data
Dec. 16, 2005   (KR) .................. 10-2005-0124378

(51) Int. Cl.
 *C23C 16/00* (2006.01)
(52) U.S. Cl. .................................. 118/721; 204/298.11
(58) Field of Classification Search ............ 204/298.11; 118/504, 505, 720, 721
See application file for complete search history.

(56) References Cited

U.S. PATENT DOCUMENTS
6,143,140 A * 11/2000 Wang et al. ............. 204/192.12

FOREIGN PATENT DOCUMENTS
| JP | 02175856 A | * | 7/1990 |
| JP | 09095762 A | * | 4/1997 |
| JP | 2005350712 A | * | 12/2005 |
| KR | 1020050022749 A | * | 3/2005 |

OTHER PUBLICATIONS

Machine Translation to Lee (KR 10-2005-0022749) published Mar. 2005.*
Machine Translation to Takahashi (JP 09095762) published Apr. 1997.*

* cited by examiner

*Primary Examiner* — Keith Hendricks
*Assistant Examiner* — John Brayton
(74) *Attorney, Agent, or Firm* — Christie, Parker & Hale, LLP

(57) ABSTRACT

A deposition apparatus including: a chamber; a mask assembly including a mask arranged to deposit a material on a substrate included in the chamber and a mask frame for supporting the mask; and a magnet unit including a first magnet unit which contacts (or adheres or chucks or secures) the mask assembly to the substrate by magnetic force; and a second magnet unit corresponding to the mask frame, in order to ensure that the mask more closely contacts the substrate.

18 Claims, 4 Drawing Sheets

DEPOSITION APPARATUS

This application claims priority to and the benefit of Korean Patent Application No. 10-2005-0124378, filed on Dec. 16, 2005, in the Korean Intellectual Property Office, the entire content of which is incorporated herein by reference.

BACKGROUND OF THE INVENTION

1. Field of the Invention

The present invention relates to a deposition apparatus, and more particularly, to a deposition apparatus in which a substrate and a mask can closely contact each other.

2. Description of the Related Art

Much research has been conducted into flat display devices, including plasma display devices, electroluminescent display devices, and liquid crystal display devices. Electroluminescent display devices are emissive type display devices and are expected to be the next generation display devices due to their wide viewing angle, high contrast, and high response speed.

Electroluminescent display devices are classified as organic electroluminescent display devices or inorganic electroluminescent display devices according to the material that forms an emission layer (EML) for each of the electroluminescent display devices. Organic electroluminescent display devices are brighter and have higher driving voltages and higher response speeds than inorganic electroluminescent display devices, and can display color images.

An organic electroluminescent display device is manufactured by forming electrodes and organic films on a substrate. Organic films are generally manufactured by deposition.

A method of depositing organic films on the substrate using a deposition apparatus is as follows. A mask is aligned with the substrate. The mask is secured (or chucked) on the substrate by magnetic force. However, the magnetic force is not strong, and when the mask and substrate are moved to a deposition source, they may become misaligned.

If organic films are deposited on the substrate when the mask is misaligned, the organic films are not formed in the desired location, and the performance of the organic electroluminescent display device is degraded. In particular, a film can be formed on a sealant portion or a terminal, which has a detrimental effect on subsequent processes.

SUMMARY OF THE INVENTION

An aspect of the present invention provides a deposition apparatus in which a substrate and a mask can closely (or more closely) contact each other.

In more detail, an aspect of the present invention provides a deposition apparatus in which a substrate and a mask can closely contact each other while ensuring films formed on the substrate are uniform.

According to an embodiment of the present invention, there is provided a deposition apparatus including: a chamber; a mask assembly including a mask arranged to deposit a material on a substrate included in the chamber and a mask frame for supporting the mask; and a magnet unit for contacting the mask assembly to the substrate by magnetic force, the magnet unit including a first magnet unit corresponding to the mask and a second magnet unit corresponding to the mask frame.

In one embodiment, the magnetic force of the first magnet unit is weaker than that of the second magnet unit.

In one embodiment, the magnetic flux density of the first magnet unit has a range from about 250 to about 350 gauss.

In one embodiment, the magnetic flux density of the second magnet unit has a range from about 650 to about 750 gauss.

In one embodiment, the material is deposited on the substrate by plasma deposition.

In one embodiment, the magnet unit further includes a gap plate between the mask and the first and second magnet units.

In one embodiment, the mask frame surrounds the mask.

In one embodiment, the second magnet unit is formed along edges of the first magnet unit.

In one embodiment, the second magnet unit is formed to close-surround the first magnet unit.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

In the following detailed description, certain exemplary embodiments of the present invention are shown and described, by way of illustration. As those skilled in the art would recognize, the described exemplary embodiments may be modified in various ways, all without departing from the spirit or scope of the present invention. Accordingly, the drawings and description are to be regarded as illustrative in nature, rather than restrictive.

Figure 1:
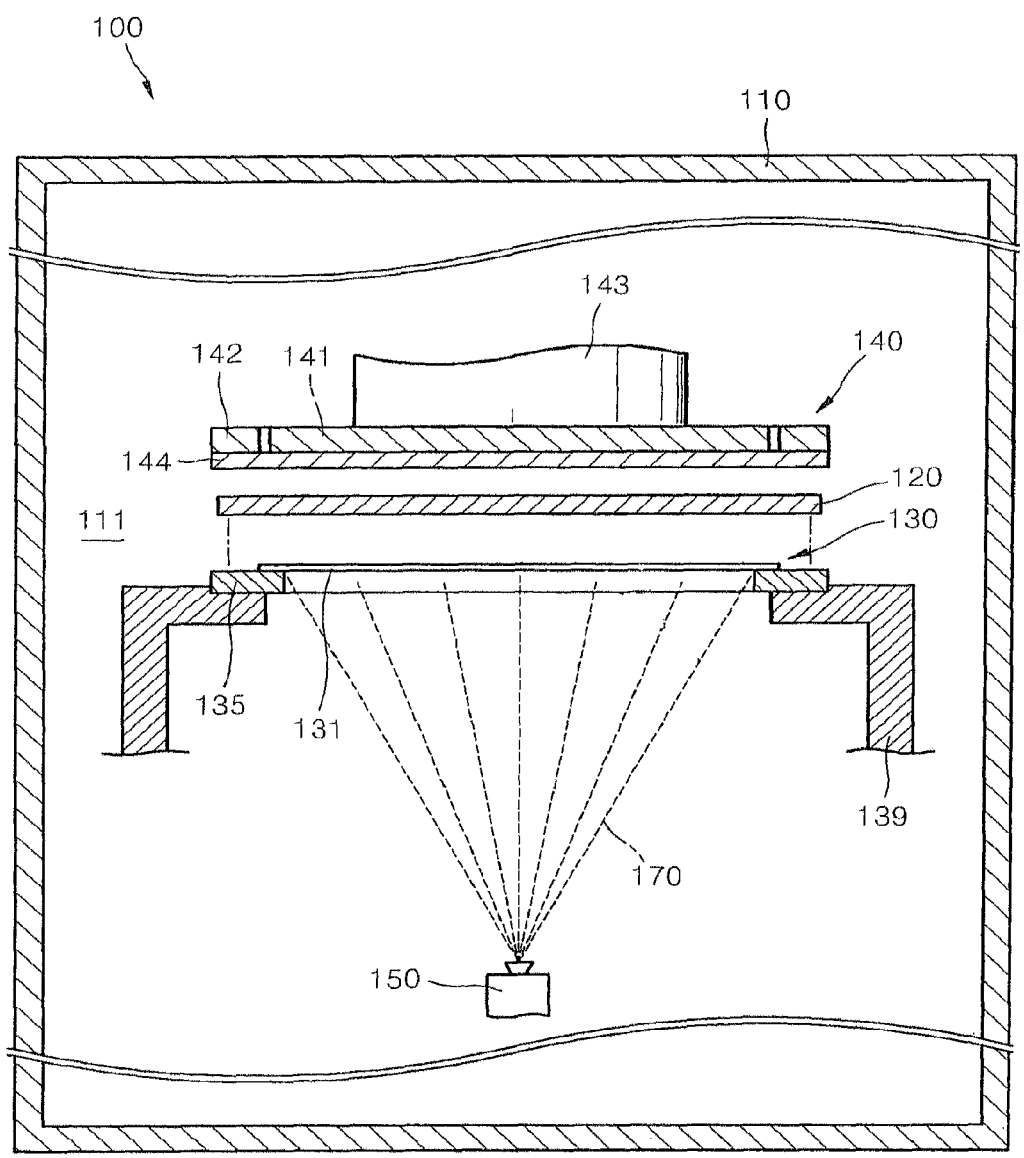
FIG. 1 is a cross-sectional view of a deposition apparatus according to an embodiment of the present invention.
Figure 2A:
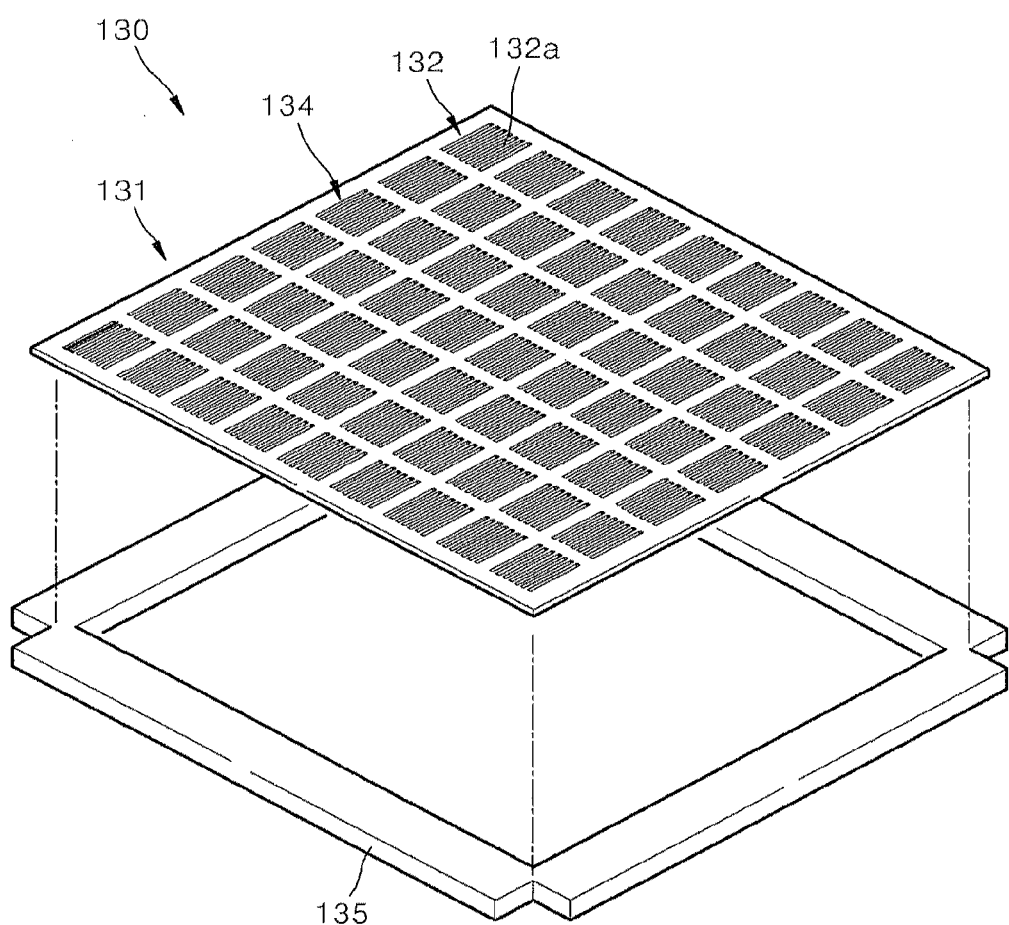
FIG. 2A is an exploded perspective view of a mask assembly illustrated in FIG. 1 according to an embodiment of the present invention.
Figure 2B:
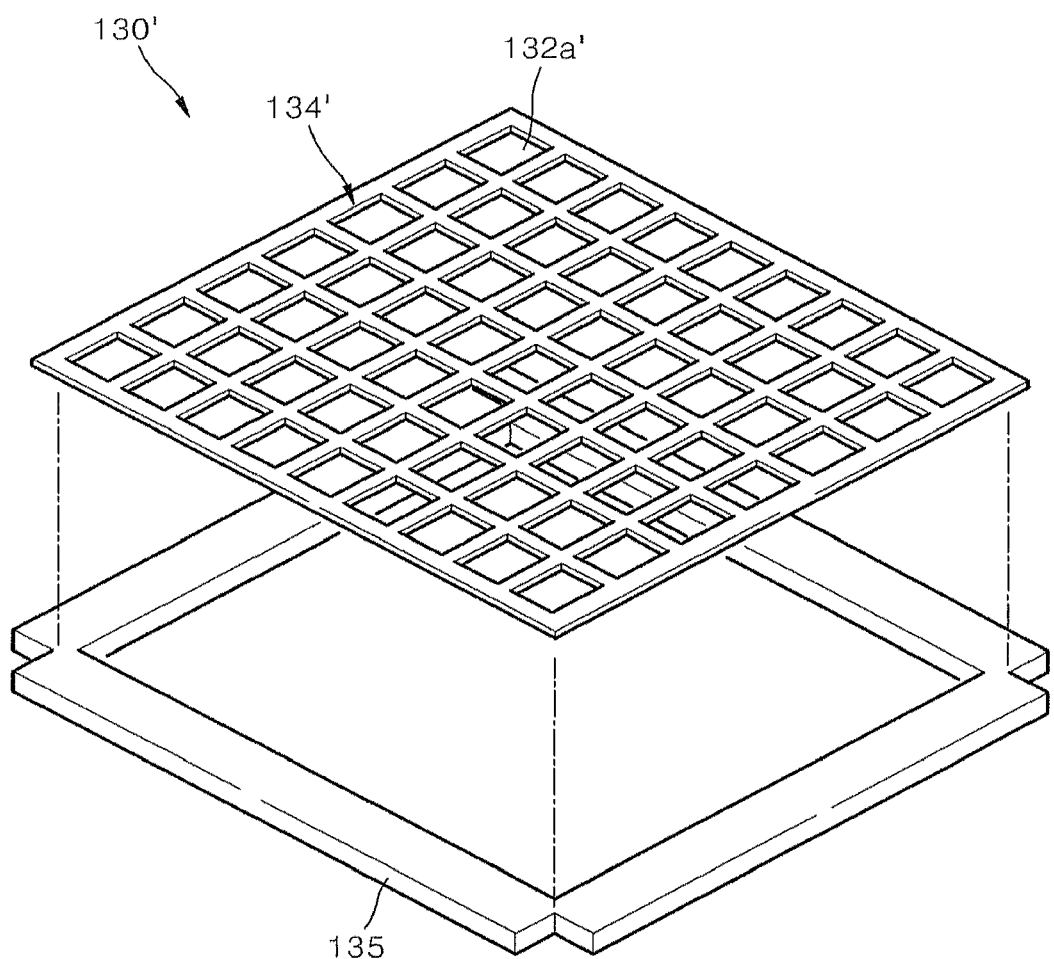
FIG. 2B is an exploded perspective view of a mask assembly illustrated in FIG. 1 according to another embodiment of the present invention.
Figure 3:
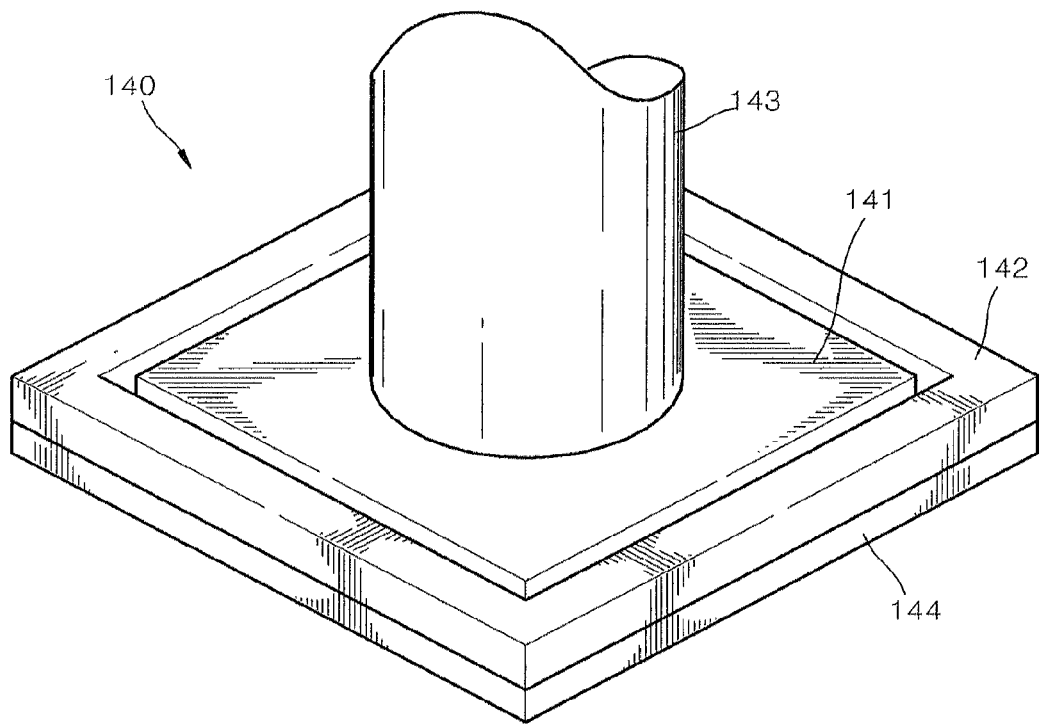
FIG. 3 is a perspective view of a magnet unit illustrated in FIG. 1.

FIG. 1 is a cross-sectional view of a deposition apparatus 100 according to an embodiment of the present invention. FIG. 2A is an exploded perspective view of a mask assembly 130 illustrated in FIG. 1 according to an embodiment of the present invention. FIG. 2B is an exploded perspective view of a mask assembly illustrated in FIG. 1 according to another embodiment of the present invention. FIG. 3 is a perspective view of a magnet unit 140 illustrated in FIG. 1.

Referring to FIG. 1, the deposition apparatus 100 includes a chamber 110 including a space 111 in which a deposition process is performed. The deposition apparatus 100 further includes a substrate support unit that supports the edges of the substrate 120 in the chamber 110. The substrate 120 may be used for an organic electroluminescent display device; however, the present invention can be used for a variety of other suitable flat panel types.

A mask assembly 130 is located under the substrate 120. The deposition apparatus 100 can further include a mask support unit 139 that supports the mask assembly 130.

Referring to FIG. 2A, the mask assembly 130 includes a mask 131 and a mask frame 135. Openings 132a are formed on the mask 131 to form an organic film or a protection film in a pattern that may be predetermined on the substrate 120. The mask frame 135 supports the mask 131 and is formed along the edges of the mask 131.

The mask assembly 130 is manufactured by forming the openings 132a on a thin metal plate 132 and combining the mask 131 with the mask frame 135. Alternatively, the mask assembly 130 can be manufactured by applying a tensile force to the mask 131 before forming the openings 132a, combining the mask 131 with the mask frame 135, and then forming the openings 132a on the thin metal plate 132.

The mask 131 and the mask frame 135 can be combined by various methods such as adhesive, laser welding and/or resistance heat welding. In one embodiment, laser welding is used to combine the mask 131 and the mask frame 135 based on a variance in the precision.

A plurality of mask units (or unit masks) 134 can be formed to have a plurality of openings 132a in each of the mask units 134.

However, the shape of the mask assembly 130 is not limited thereto. Referring to FIG. 2B, a mask assembly 130' has mask units (or unit masks) 134' that can be formed to have an opening 132a' in each of the mask units 134'.

The openings 132a and/or 132a' can have various shapes such as a discontinuous dot line shape, a stripe shape or a combination thereof.

Referring to FIG. 1, a deposition source 150 is aligned with the substrate 120, facing the mask assembly 130. The deposition source 150 is a heating container. However, the present invention is not thereby limited, and the deposition apparatus 100 of the present invention can have a plurality of heating containers, which are arranged in a line that may or may not rotate. Also, the layout of the heating containers of the present invention is not thereby limited, and can have other suitable layouts.

Referring to FIGS. 1 through 3, the deposition apparatus 100 includes a magnet unit 140 located on the upper portion of the substrate 120. The magnet unit 140 enables the mask assembly 130 to contact the substrate 120 in order to maintain the securing (or chucking) of the mask 131. The magnet unit 140 pulls the mask assembly 130 formed of metal by magnetism to fix the substrate 120 and the mask assembly 130 to the magnet unit 140.

The magnet unit 140 includes a support 143, a gap pad (or gap plate) 144, a first magnet unit 141, and a second magnet unit 142. The support 143 supports the first magnet unit 141 and the second magnet unit 142. The first magnet unit 141 is formed to correspond to the mask 131 on the gap pad 144 and the second magnet unit 142 is formed to correspond to the mask frame 135 on the gap pad 144.

The first magnet unit 141 has a substantially rectangular cross-section. The second magnet unit 142 has a closed loop shape surrounding the first magnet unit 141. However, the shape of the first magnet unit 141 and the second magnet unit 142 is not limited thereto. The first magnet unit 141 and the second magnet unit 142 can include a plurality of magnets discontinuously arranged. The first magnet unit 141 and the second magnet unit 142 can be formed of permanent magnets and/or electromagnets.

Organic thin films formed of organic materials such as a Hole Injection Layer (HIL), a Hole Transport Layer (HTL), an EML, an Electron Transport Layer (ETL), an Electron Injection Layer (EIL), etc. can be formed on the substrate 120. Protection films can be formed on the substrate 120 to protect electrodes. The organic thin films and the protection films are deposited on the substrate 120 by various deposition methods. One suitable deposition method is to use a plasma coating system. The plasma coating system injects plasma into the chamber 110 using a plasma gun. The plasma can be formed of argon (Ar) gas, and heats a deposition material 170 in the deposition source 150. The heated deposition material 170 is vaporized and deposited on the substrate 120. At this time, since the plasma has ionized particles or electrons, if an extremely strong magnetic field is applied to the magnet unit 140, an electromagnetic force is applied to the plasma. Therefore, since an operator cannot easily control the plasma in the chamber 110, the organic thin films or protection films formed on the substrate 120 cannot be uniform. However, if the magnetism of the magnet unit 140 is reduced to address this problem, the chucking between the mask 131 and the substrate 120 is not maintained, and the mask 131 and the substrate 120 may become misaligned.

Figure 4:
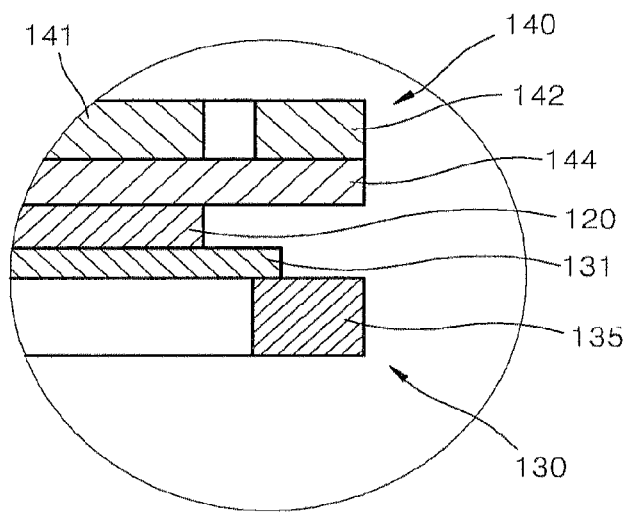
FIG. 4 is a cross-sectional view of a portion where the mask assembly and the magnet unit contact each other.

However, the structure of the present invention can solve the above problem. FIG. 4 is a cross-sectional view of a portion where the mask assembly 130 and the magnet unit 140 contact each other.

Referring to FIG. 4, the magnetism of the magnet unit 140 is increased by the second magnet unit 142 corresponding to the mask frame 135. Since the substrate 120 and the mask 131 contact each other more closely due to the increased magnetism, they can be accurately aligned, thereby improving the quality of films formed on the substrate 120.

The mask frame 135 is not substantially involved with the deposition process. The magnetic field applied to the mask frame 135 has very little effect on the quality of films formed on the substrate 120. Therefore, since a magnetic force is applied to the mask 131 and also to the mask frame 135, the substrate 120 and the mask assembly 130 can contact each other more closely. In particular, if the magnetic force of the second magnet unit 142 is stronger than the magnetic force of the first magnet unit 141, the substrate 120 and the mask assembly 130 can contact each other more closely, and this can also reduce the influence of the electromagnetic force on the quality of films.

The first magnet unit 141 may have a magnetic flux density ranging from 250 to 350 gauss in order to reduce its influence on the plasma while maintaining the contact between the mask assembly 130 and the substrate 120. In this regard, the surface electric field of the substrate 120 is below about 80 gauss, thereby ensuring that films formed on the substrate 120 are uniform.

The second magnet unit 142 may have a magnetic flux density ranging from 650 to 750 gauss in order to maintain stable chucking.

The deposition apparatus of the present invention maintains closer contact between a substrate and a mask, thereby allowing accurate alignment of the substrate and the mask.

While the invention has been described in connection with certain exemplary embodiments, it is to be understood by those skilled in the art that the invention is not limited to the disclosed embodiments, but, on the contrary, is intended to cover various modifications included within the spirit and scope of the appended claims and equivalents thereof.

What is claimed is:

1. A deposition apparatus comprising:
    a chamber;
    a mask assembly comprising a mask arranged to deposit a material on a surface of a substrate in the chamber and a mask frame for supporting the mask; and
    a magnet unit for contacting a surface of the mask assembly to the surface of the substrate by magnetic force, the magnet unit comprising a first magnet unit corresponding to the mask and providing a first magnetic force for contacting the surface of the mask assembly to the surface of the substrate and a second magnet unit corresponding to the mask frame and providing a second magnetic force for contacting the surface of the mask assembly to the surface of the substrate, wherein the first magnetic force is weaker than the second magnetic force and wherein a magnetic flux density of the first magnet unit is smaller than a magnetic flux density of the second magnet unit.

2. The deposition apparatus of claim 1, wherein the magnetic flux density of the first magnet unit is about 250 to about 350 gauss.

3. The deposition apparatus of claim 1, wherein the magnetic flux density of the second magnet unit is about 650 to about 750 gauss.

4. The deposition apparatus of claim 1, wherein the material is deposited on the substrate by plasma deposition.

5. The deposition apparatus of claim 1, wherein the magnet unit further comprises a gap plate between the mask and the first and second magnet units.

6. The deposition apparatus of claim 1, wherein the mask frame surrounds the mask.

7. The deposition apparatus of claim 1, wherein the second magnet unit is formed along edges of the first magnet unit.

8. The deposition apparatus of claim 7, wherein the second magnet unit is formed to surround the first magnet unit.

9. A deposition apparatus comprising:
a deposition source for depositing a material to a substrate;
a mask assembly comprising a mask arranged to deposit the material on the substrate and a mask frame for supporting the mask; and
a magnet unit for contacting the mask assembly to the substrate by magnetic force, the magnet unit comprising a first magnet unit corresponding to the mask and providing a first magnetic force for contacting the mask assembly to a surface of the substrate facing the deposition source and a second magnet unit corresponding to the mask frame and providing a second magnetic force for contacting the mask assembly to the surface of the substrate facing the deposition source, wherein the second magnetic force is stronger than the first magnetic force, and wherein a magnetic flux density of the first magnet unit is smaller than a magnetic flux density of the second magnet unit.

10. The deposition apparatus of claim 9, wherein the material is deposited from the deposition source to the substrate through the mask assembly.

11. The deposition apparatus of claim 10, wherein the material is deposited on the substrate by plasma deposition.

12. The deposition apparatus of claim 9, wherein the magnetic flux density of the first magnet unit is about 250 to about 350 gauss.

13. The deposition apparatus of claim 9, wherein the magnetic flux density of the second magnet unit is about 650 to about 750 gauss.

14. The deposition apparatus of claim 9, wherein the magnetic flux density of the first magnet unit is about 250 to about 350 gauss, and wherein the magnetic flux density of the second magnet unit is about 650 to about 750 gauss.

15. The deposition apparatus of claim 9, wherein the magnet unit further comprises a gap plate between the mask and the first and second magnet units.

16. The deposition apparatus of claim 9, wherein the mask frame surrounds the mask.

17. The deposition apparatus of claim 9, wherein the second magnet unit is formed along edges of the first magnet unit.

18. The deposition apparatus of claim 9, wherein the second magnet unit is formed to surround the first magnet unit.

* * * * *

UNITED STATES PATENT AND TRADEMARK OFFICE
CERTIFICATE OF CORRECTION

PATENT NO. : 8,192,546 B2
APPLICATION NO. : 11/637375
DATED : June 5, 2012
INVENTOR(S) : Hun Kim et al.

It is certified that error appears in the above-identified patent and that said Letters Patent is hereby corrected as shown below:

In the Claims

Column 5, Claim 1, line 2          Delete "force"

Insert -- force, --

Signed and Sealed this
First Day of July, 2014

Michelle K. Lee
*Deputy Director of the United States Patent and Trademark Office*